United States Patent
Zang et al.

(10) Patent No.: US 10,128,187 B2
(45) Date of Patent: Nov. 13, 2018

(54) INTEGRATED CIRCUIT STRUCTURE HAVING GATE CONTACT AND METHOD OF FORMING SAME

(71) Applicant: GLOBALFOUNDRIES INC., Grand Cayman (KY)

(72) Inventors: Hui Zang, Guilderland, NY (US); Josef S. Watts, Stillwater, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 46 days.

(21) Appl. No.: 15/206,361

(22) Filed: Jul. 11, 2016

(65) Prior Publication Data
US 2018/0012839 A1    Jan. 11, 2018

(51) Int. Cl.
| | | |
|---|---|---|
| *H01L 21/70* | (2006.01) | |
| *H01L 23/528* | (2006.01) | |
| *H01L 21/768* | (2006.01) | |
| *H01L 23/535* | (2006.01) | |
| *H01L 23/66* | (2006.01) | |
| *H01L 29/06* | (2006.01) | |
| *H01L 29/78* | (2006.01) | |

(52) U.S. Cl.
CPC .... *H01L 23/5283* (2013.01); *H01L 21/76805* (2013.01); *H01L 21/76819* (2013.01); *H01L 21/76834* (2013.01); *H01L 21/76883* (2013.01); *H01L 21/76895* (2013.01); *H01L 23/535* (2013.01); *H01L 23/66* (2013.01); *H01L 29/0653* (2013.01); *H01L 29/785* (2013.01)

(58) Field of Classification Search
CPC ........... H01L 23/5283; H01L 21/76805; H01L 21/76819; H01L 21/76834; H01L 21/76883; H01L 21/76895; H01L 23/535; H01L 23/66; H01L 29/785
See application file for complete search history.

(56) References Cited

U.S. PATENT DOCUMENTS

| | | | |
|---|---|---|---|
| 2009/0014796 A1* | 1/2009 | Liaw | H01L 27/11 257/347 |
| 2013/0264639 A1 | 10/2013 | Glass et al. | |
| 2014/0001520 A1* | 1/2014 | Glass | H01L 29/66439 257/288 |
| 2015/0380558 A1 | 12/2015 | Huang | |
| 2016/0141423 A1 | 5/2016 | Diaz et al. | |
| 2016/0197071 A1 | 7/2016 | Yeh et al. | |

OTHER PUBLICATIONS

Taiwanese Office Action and English Translation thereof for TW Patent Application No. 106117386 dated Jun. 11, 2018, 9 pages.

* cited by examiner

*Primary Examiner* — Elias M Ullah
(74) *Attorney, Agent, or Firm* — Yuanmin Cai; Hoffman Warnick LLC (57) ABSTRACT

One aspect of the disclosure relates to an integrated circuit structure. The integrated circuit structure may include: a gate stack having a gate conductor therein over a substrate, the gate stack being within a dielectric layer; a source/drain contact to a source/drain region over the substrate and adjacent to the gate stack within the dielectric layer; a conductor extending above, without contacting, the source/drain contact and extending within the dielectric layer to contact the gate conductor within the gate stack.

17 Claims, 7 Drawing Sheets

INTEGRATED CIRCUIT STRUCTURE HAVING GATE CONTACT AND METHOD OF FORMING SAME

BACKGROUND

Technical Field

The present disclosure relates to integrated circuit (IC) structures, and more particularly, to an integrated circuit structure having a gate contact and method of forming the same.

Related Art

Advanced manufacturing of integrated circuits requires formation of individual circuit elements, e.g., field-effect-transistors (FETs) and the like based on specific circuit designs. A FET generally includes source, drain, and gate terminals. The gate terminal is placed between the source and drain terminals and control the current therebetween. Transistors may be formed over a substrate and may be electrically isolated with an insulating dielectric layer, e.g., inter-level dielectric layer. Contacts may be formed to each of the source, drain, and gate terminals through the dielectric layer in order to provide an electrical connection between the transistors and other circuit elements that may be formed subsequent to the transistor in other metal levels.

A radiofrequency (RF) transistor is a device used to amplify and switch RF signals and power. As scaling down of integrated circuits continues, the RF cutoff frequency for RF transistors ($f_T$) increases while the maximum oscillation frequency ($f_{max}$) for the same decreases. Cutoff frequency refers to a frequency that is below which a transistor will not operate. Put another way, cutoff frequency is the highest frequency which the transistor is useful in RF applications. Maximum oscillation frequency refers to the frequency at which the maximum stable power gain (Gms) and the maximum available power gain (Gma) of a device equal 1. One parameter that reduces the maximum oscillation frequency is gate resistance. As IC structures are scaled down, gate resistance increases causing a reduction of the maximum oscillation frequency.

Figure 1:
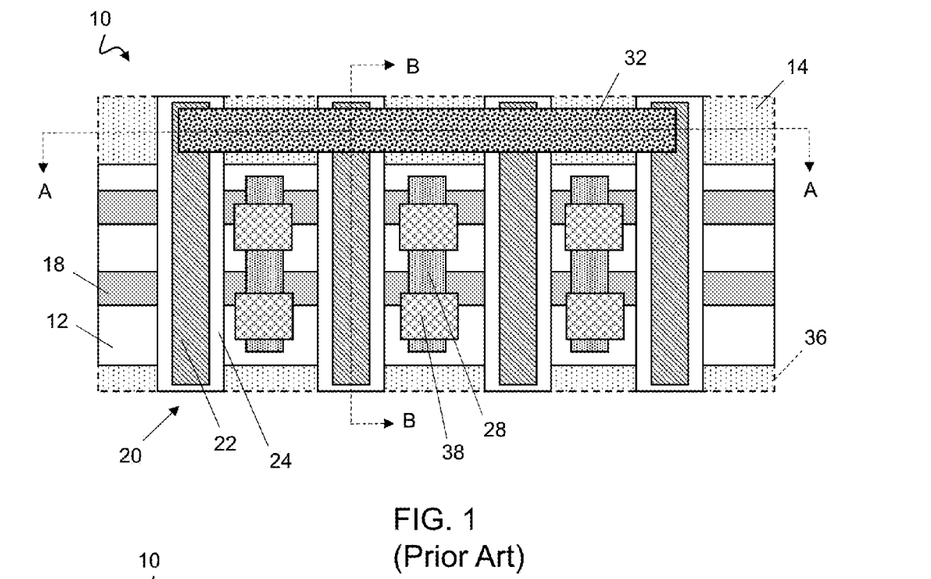
FIG. 1 shows a top-down view of a prior art integrated circuit (IC) structure.
Figure 2:
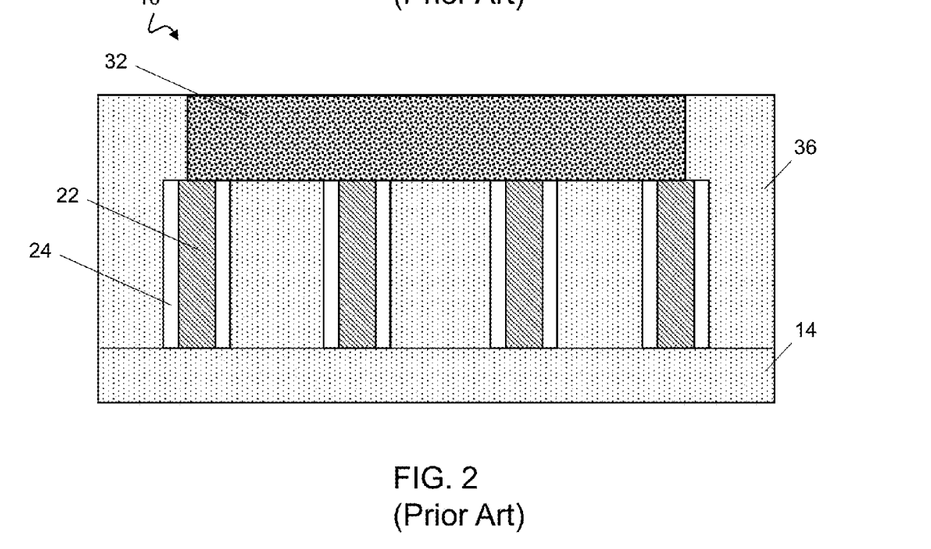
FIG. 2 shows a cross-section of the prior art IC structure of FIG. 1 taken along line A-A.
Figure 3:
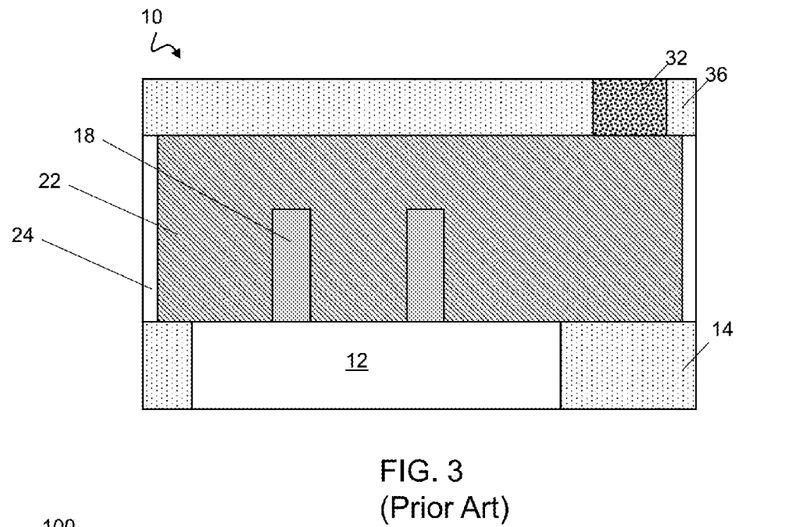
FIG. 3 shows a cross-section of the prior art IC structure of FIG. 1 taken along line B-B.

FIG. 1 shows an example of a prior art IC structure 10. FIG. 2 shows a cross-section of IC structure 10 taken along line A-A. FIG. 3 shows a cross-section of IC structure 10 taken along B-B. Referring to FIGS. 1-3 together, IC structure 10 may include a substrate 12 (FIGS. 1 and 3) adjacent to a shallow trench isolation (STI) region 14. A set of fins 18 (FIGS. 1 and 3) may be formed form substrate 12. Substantially surrounding fins 18 over portions of substrate 12 and STI region 14 may be gate stacks 20. Gate stacks 20 may include a gate conductor 22 and gate spacers 24.

IC structure 10 may also include source/drain contacts 28 (FIGS. 1 and 3) overlying portions of fins 18 to provide electrical connection to source/drain regions (not shown) therein. Source/drain contacts 28 may be adjacent to gate stacks 20 over substrate 12 and STI region 14. IC structure 10 may also include a gate contact 32. Gate contact 32 provides electrical connection to gate stacks 20. IC structure 10 may also include a dielectric layer 36 over substrate 12 and STI region 14. Dielectric layer 36 may substantially surround fins 18, gate stacks 20, source/drain contacts 28, and gate contact 32. In FIG. 1, dielectric layer 36 is shown by phantom box in order to show features of IC structure 10 thereunder. Further, IC structure 10 may also include one or more contacts 38 to source/drain contacts 28. Contacts 38 may be disposed within dielectric layer 36 in the same plane as gate contact 32. Contacts 38 provide electrical connection from source/drain contacts 28 to other structures and devices that may be formed in metal levels above dielectric layer 36.

Conventional gate contacts 32 are formed over gate stacks 20 over STI region 14 and not over gate stacks 20 in the active region, or over substrate 12. Forming gate contacts 32 over STI region 14 results in a high gate resistance. Gate resistance is dependent in part on the length of gate stacks 20 and the distance of gate contact 32 to each end of gate stacks 20. When gate contacts 32 are formed over STI region 14, gate contacts 32 are closer to one end of gate stacks 32 than the other. Thus, an increase in gate resistance reduces the maximum oscillation frequency and RF cutoff frequency increases.

SUMMARY

A first aspect of the disclosure provides for a method of forming an integrated circuit structure. The method may include: lowering a height of a source/drain contact within a first dielectric layer to a height below a height of a gate conductor of a gate stack, the gate stack being adjacent to the gate conductor within the dielectric layer; and forming a conductor over and without contacting the source/drain contact, the conductor contacting the gate conductor.

A second aspect of the disclosure provides for a method of forming and integrated circuit structure. The method may include: lowering a height of one or more source/drain contacts in a set of source/drain contacts below a height of a gate conductor within a gate stack of a set of gate stacks, the one or more source/drain contacts in the set of source/drain contacts being adjacent to the gate stack of the set of gate stacks within a first dielectric layer; and forming a conductor over and without contacting the set of source/drain contacts, the conductor contacting each gate conductor.

A third aspect of the disclosure provides for an integrated circuit structure. The integrated circuit structure may include: a gate stack having a gate conductor therein over a substrate, the gate stack being within a dielectric layer; a source/drain contact to a source/drain region over the substrate and adjacent to the gate stack within the dielectric layer; a conductor extending above, without contacting, the source/drain contact and extending within the dielectric layer to contact the gate conductor within the gate stack.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the invention, and therefore should not be considered as limiting the scope of the invention. In the drawings, like numbering represents like elements between the drawings.

DETAILED DESCRIPTION

The present disclosure relates to an integrated circuit (IC) structure, and more particularly, to an integrated circuit structure having a gate contact and method of forming the same. Embodiments discussed herein provide a method of forming, and a corresponding structure, for a radiofrequency (RF) transistor having a reduced gate resistance. The IC structure as described herein includes a gate contact within the active region of the IC structure which causes a reduction in gate resistance. With the gate contact being located within active region, the gate contact is closer to each end of the gate stack than conventional gate contacts that are located over the STI region. The reduction of the gate resistance results in an increase in the maximum oscillation frequency ($f_{max}$) and a decrease in RF cutoff frequency ($f_T$).

Figure 4:
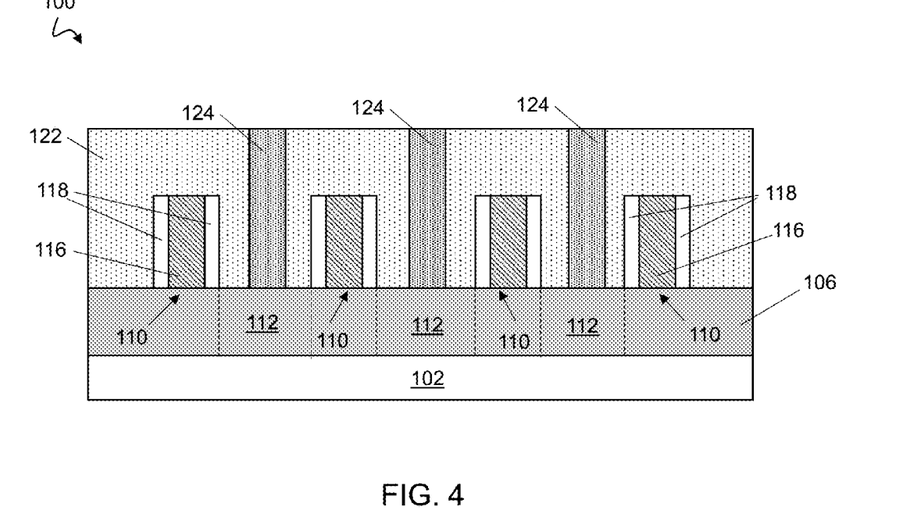
FIGS. 4-9 show a cross-section of a preliminary IC structure undergoing aspects of a method according to embodiments of the disclosure with FIG. 9 showing a resulting IC structure.
Figure 7:
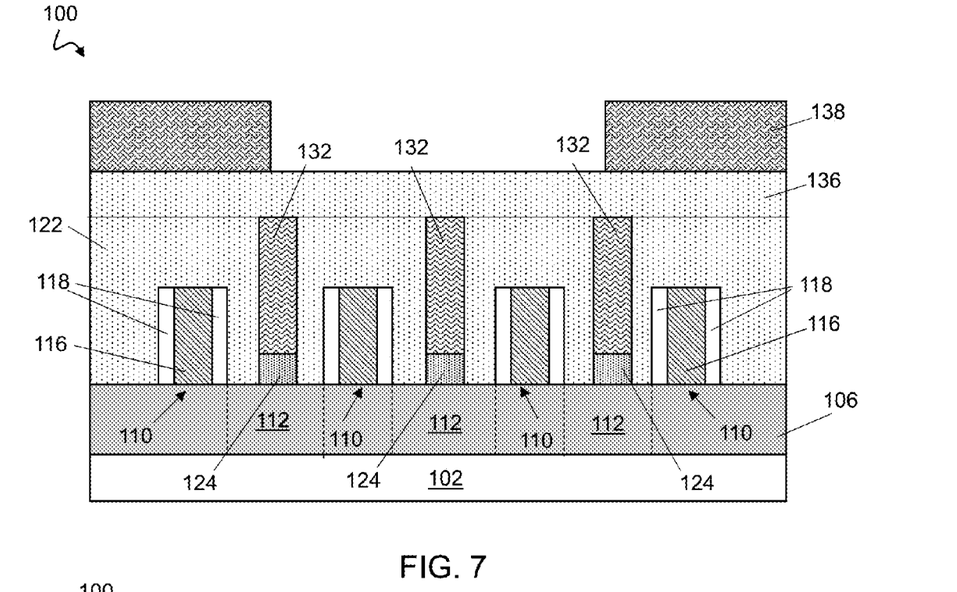
Figure 8:
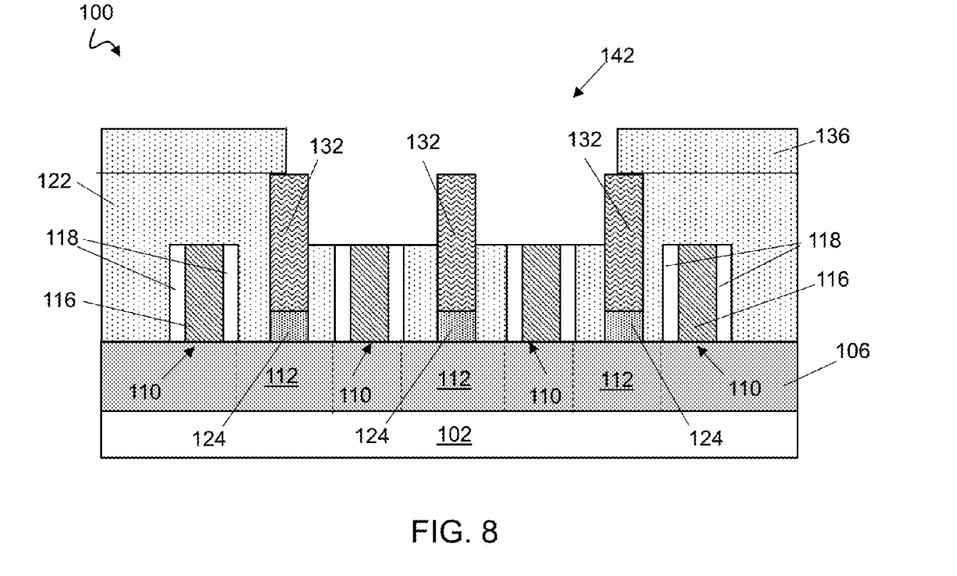
Figure 9:
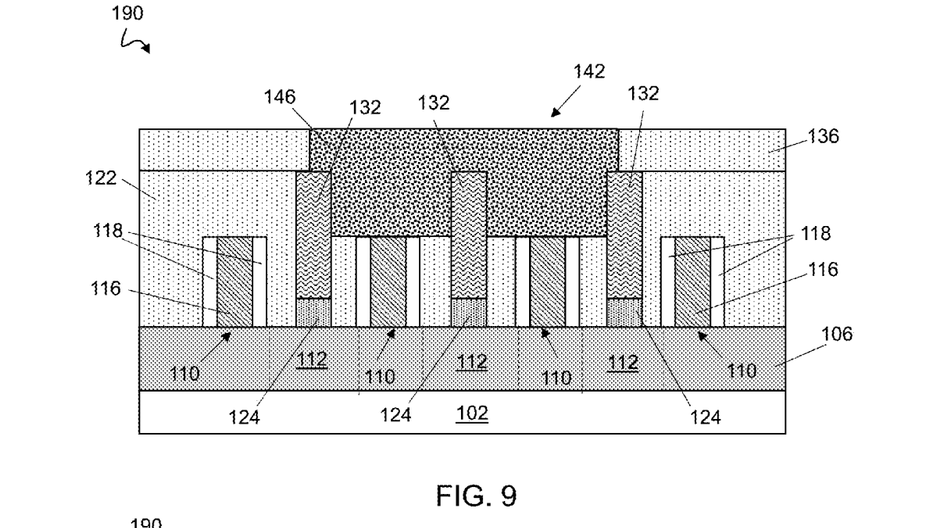

FIGS. 4-9 show a cross-section of a preliminary IC structure undergoing aspects of a method according to embodiments of the disclosure, with FIG. 9 showing a resulting IC structure. Referring now to FIG. 4, a preliminary IC structure 100 is shown. IC structure 100 may be a fin-shaped field effect transistor (finFET) as shown. IC structure 100 may include a substrate 102 from which a fin 106 may be formed such that fin 106 is over substrate 102. In some embodiments, substrate 102 may include a semiconductor-on-insulator (SOI) substrate. In such an embodiment, substrate 102 may include a semiconductor layer, an insulator layer overlying the semiconductor layer, and another semiconductor layer overlying the insulator layer. An SOI substrate may be formed by depositing the insulator layer over the semiconductor layer and depositing another semiconductor layer over the insulator layer. The semiconductor layers may each include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The insulator layer may include silicon oxide (BOX layer) or other inorganic dielectric materials.

A shallow trench isolation (STI) region (not shown in FIG. 1) may be disposed adjacent to substrate 102 as will be described herein. As known in the art, STI regions separate or isolate adjacent semiconductor devices that are on the same plane from one another. STI regions prevent electrical current leakage from the adjacent semiconductor devices. STI regions typically include an insulator, such as, for example, silicon dioxide. STI regions may be formed by etching portions of substrate 102 to form trenches therein, and filling the trenches, e.g., via depositing, with the insulator.

As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Fin 106 maybe patterned and etched from the semiconductor layer overlying the insulator layer as is known in the art. In another embodiment, substrate 102 may include a bulk silicon substrate from which fin 106 may be patterned and etched as is known in the art. While IC structure 100 is shown and described as a finFET, it is to be understood that IC structure 100 may be any other type of transistor, e.g., a planar transistor, without departing from aspects of the disclosure.

"Etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Conventional device processing may continue by forming gate stacks 110 and source/drain regions 112 in, on, and/or surrounding fin 106 as known in the art. Gate stacks 110 may substantially surround fin 106 over substrate 102. While four gate stacks have been shown, any number of gate stacks may be formed over fin 106 without departing from aspects of the disclosure. Gate stacks 110 may each include a gate conductor 116 and gate spacers 118 substantially surrounding gate conductor 116. Gate conductor 116 may include, for example, titanium, titanium nitride, tungsten, tungsten nitride, copper, copper nitride, tantalum, or tantalum nitride. While not shown herein, it is to be understood that gate stacks 110 may also include a gate dielectric (not shown) and work function metal layers (not shown) between fin 106 and gate conductor 116. Further, overlying gate conductor 116 may be a gate cap layer (not shown). The gate dielectric may include, for example, at least one of: hafnium oxide, hafnium silicate, nitride hafnium silicate, zirconium oxide, zirconium silicate, titanium oxide, lanthanum oxide, yttrium oxide, aluminum oxide, or combinations thereof. The work function metal layers may act as a doping source, and a different work function setting metal can then be employed depending on whether an n-type field-effect-transistor (NFET) or a p-type field-effect-transistor (PFET) device is desired. Thus, the same gate conductor can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. The gate cap layer may include, for example, at least one of: an oxide, e.g., silicon dioxide, or a nitride, e.g., silicon nitride. Gate spacers 118 may include, for example, at least one of: an oxide, e.g., silicon dioxide, or a nitride, e.g., silicon nitride.

After gate stack 110 formation, source/drain regions 112 may be formed from exposed portions of fins 106, e.g., between gate stacks 110. Source/drain regions 112 may be formed by doping, depositing, and/or epitaxial growth of semiconducting material on or around fins 106. For example, source/drain regions 112 may be formed by implanting n-type or p-type dopants directly into fin 106. In another example, source/drain regions 112 may be formed by growth of an epitaxial material 172 from fins 106 such that epitaxial material 172 surrounds fins 106 as shown in the cross-sectional views of FIGS. 11 and 13. Epitaxial material 172 may be chosen dependent on whether a PFET or an NFET is desired. In one example, where an NEFT is desired, silicon may be epitaxially grown and subsequently doped with an n-type dopant, e.g., carbon, such that epitaxial material includes carbon-doped silicon. In another example, where a PFET is desired, silicon germanium may be epitaxially grown and subsequently doped with a p-type dopant, e.g., boron, such that epitaxial material includes boron-doped silicon germanium.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

IC structure 100 may also include a dielectric layer 122 over fin 106 (including any epitaxial material surrounding fin 106) and substantially surrounding gate stacks 110. Dielectric layer 122 may include, for example, silicon nitride, silicon oxide, fluorinated $SiO_2$ (FSG), hydrogenated silicon oxycarbide (SiCOH), porous SiCOH, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric layer 122 may be formed by deposition of dielectric layer material.

IC structure 100 may also include source/drain contacts 124. Source/drain contacts 124 may be formed by forming a mask (not shown), patterning the mask, and etching an opening (not shown) within dielectric layer 122 to expose source/drain regions 112 of fin 106 (including any source/drain region 112 formed from any epitaxial material surrounding fin 106). Source/drain contacts 124 may be formed within the opening. Source/drain contacts 124 may contact source/drain region 112 and provide electrical connect thereto. Source/drain contacts 124 may be formed by depositing a liner layer, e.g., titanium, and a metallization layer within the opening to fill the opening. Further, the process may include annealing source/drain regions 112 at the bottom of the opening to create a silicide (not shown) therein, i.e., silicon metal alloy, thereby creating a surface for the contact connection. The silicide that is formed in aforementioned manner may be called liner silicide. Source/drain contact 124 may be planarized to a top surface of dielectric layer 122.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

A "mask" is a material or stack of materials which may be formed over an underlying material which is to be processed. The mask may be patterned to have openings such that the underlying material is exposed. Subsequently, the underlying material may be processed where the underlying material is exposed by the openings in the mask. Once the underlying material is processed, the mask may be removed. Conventional masking materials include photoresist, silicon oxide, amorphous carbon, spin-on materials and silicon nitride.

Figure 5:
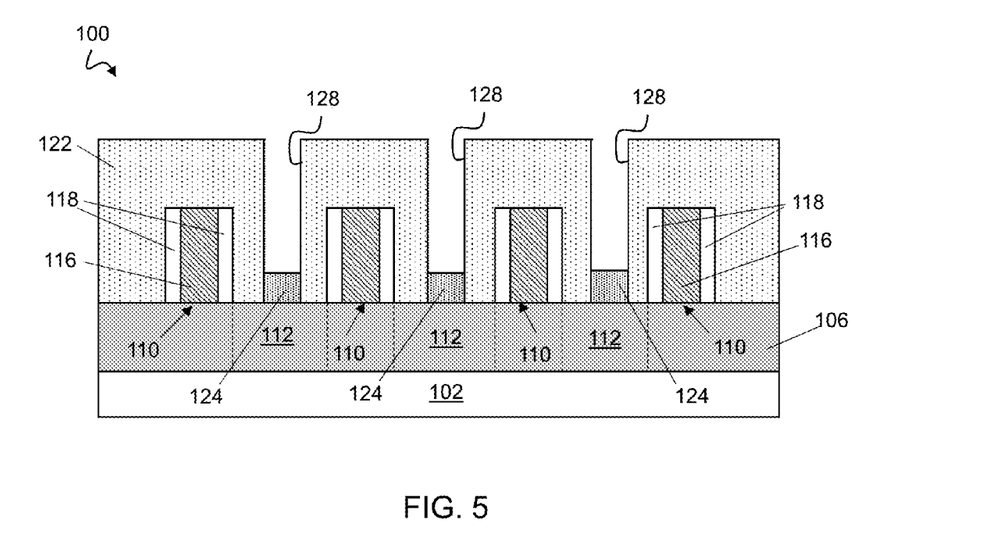
Figure 6:
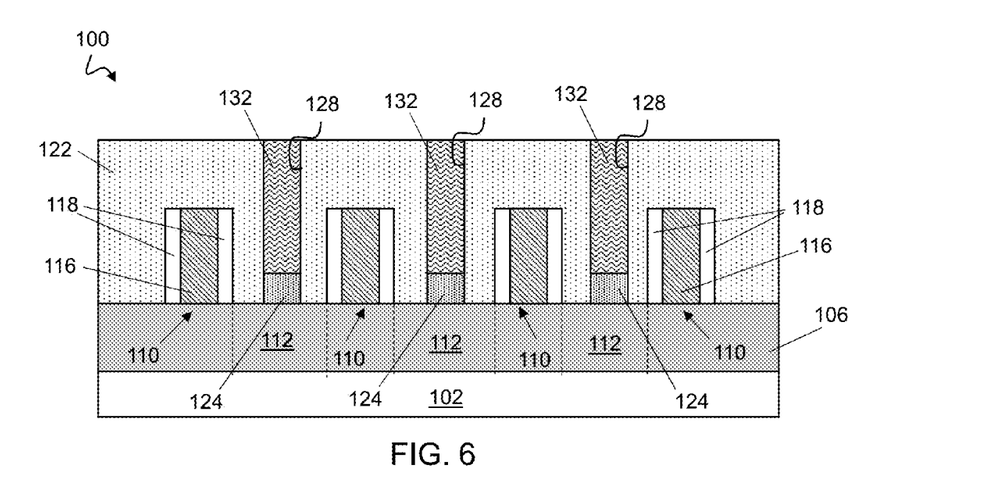

Referring now to FIG. 5, source/drain contacts 124 may be recessed to create openings 128 within dielectric layer 122 over source/drain contacts 124. That is, a height of source/drain contacts 124 may be lowered to a height that is below a height of gate conductor 116 of each gate stack 110. Source/drain contacts 124 may be recessed by etching, e.g., RIE. Source/drain contacts 124 may be etched such that a portion of source/drain contacts 124 remain over source/drain regions 112 within fin 106. Turning to FIG. 6, an insulating layer 132 may be formed within openings 128 over the recessed source/drain contacts 124. Insulating layer 132 may include a layer having a low dielectric constant (low-k dielectric layer). Low-k dielectric layer may include, for example, silicon nitride, silicon oxide, fluorinated $SiO_2$ (FSG), hydrogenated silicon oxycarbide (SiCOH), porous SiCOH, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof insulating layer 132 may then be formed by depositing insulating layer material within opening(s) 128 and planarizing the insulating layer material to a top surface of dielectric layer 122.

Referring now to FIG. 7, another dielectric layer 136 may be formed, e.g., deposited, over dielectric layer 122 and insulating layer 132. Dielectric layer 136 may include any of the materials discussed with respect to dielectric layer 122 such that dielectric layer 136 and dielectric layer 122 may, in one instance, be of the same material or composition. Further, a mask 138 may be formed, e.g., deposited, over dielectric layer 136. Mask 138 may be patterned and etched to expose a portion of dielectric layer 136 where it is desired for dielectric layer 136 to be etched.

As shown in FIG. 8, the exposed portions of dielectric layer 136 may be removed, e.g., via etching (RIE). The etching may continue through dielectric layer 122 until top portions of gate conductor 116 of any underlying gate stack 110 are exposed by an opening 142. Opening 142 may also expose portions of insulating layer 132. In an embodiment where there is a gate cap layer (not shown) over gate conductor 116, the gate cap layer may also be removed, e.g., via etching, to expose gate conductor 116 thereunder.

Referring now to FIG. 9, a conductor 146 may be formed within opening 142 such that conductor 146 is formed over, and without contacting, source/drain contacts 124. Conductor 146 may be formed such that conductor 146 contacts gate conductor 116 and portions of low-k dielectric layer 132. Conductor 146 may be a gate contact providing electrical connection to gate stacks 110 thereunder. Conductor 146 may include, for example, tungsten, cobalt, or copper. Conductor 146 may be planarized to a top surface of dielectric layer 136. The resulting IC structure 190 after planarization may include gate stack 110 having gate conductor 116 therein over substrate 102. Gate stack 110 may be within dielectric layer 122. IC structure 190 may also include source/drain contact 124 to a source/drain region 112 over substrate 102 and adjacent to gate stack 110 within dielectric layer 122. Further, insulating layer 132 may be disposed within opening 128 (FIGS. 2-3) over source/drain contact 124 within dielectric layer 122 and separate source/drain contact 124 and conductor 146. In some embodiments, portions of insulating layer 132 may be disposed within dielectric layer 136. Conductor 146 may extend over at least a portion of the insulating layer 132 and extend within portions of dielectric layers 122, 136 to contact gate conductor 116 within the gate stack 110.

It is to be understood that processes of the disclosure as described herein may be customized based on desired application of IC structure 190. That is, the forming the patterning and etching of mask 138 (FIG. 7) to form opening 142 (FIGS. 8-9) may be customized and/or modified to result in opening 142 having any desired configuration to expose portions of gate conductors 116 of gate stacks 110 and low-k dielectric layers 132 thereunder.

Figure 10:
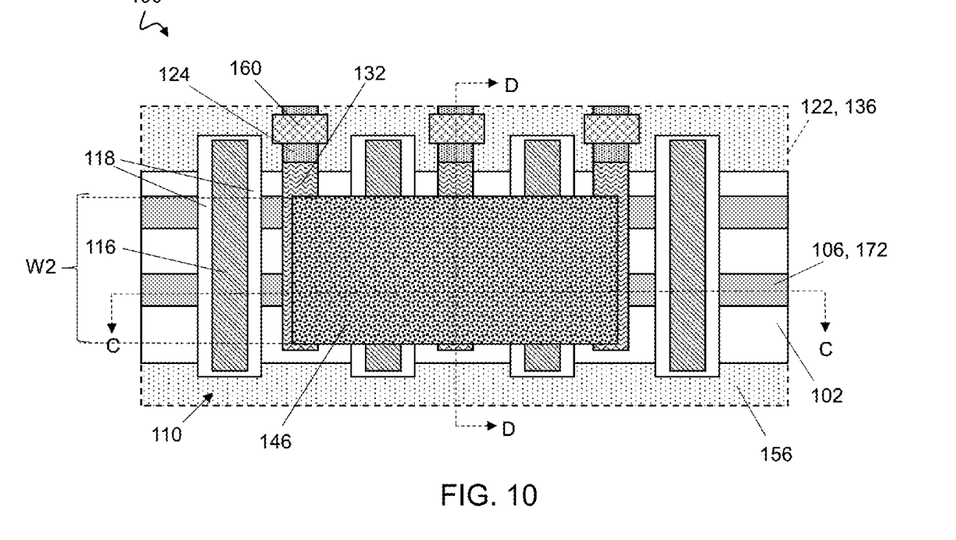
FIG. 10 shows a top-down view of an IC structure according to an embodiment of the disclosure.
Figure 11:
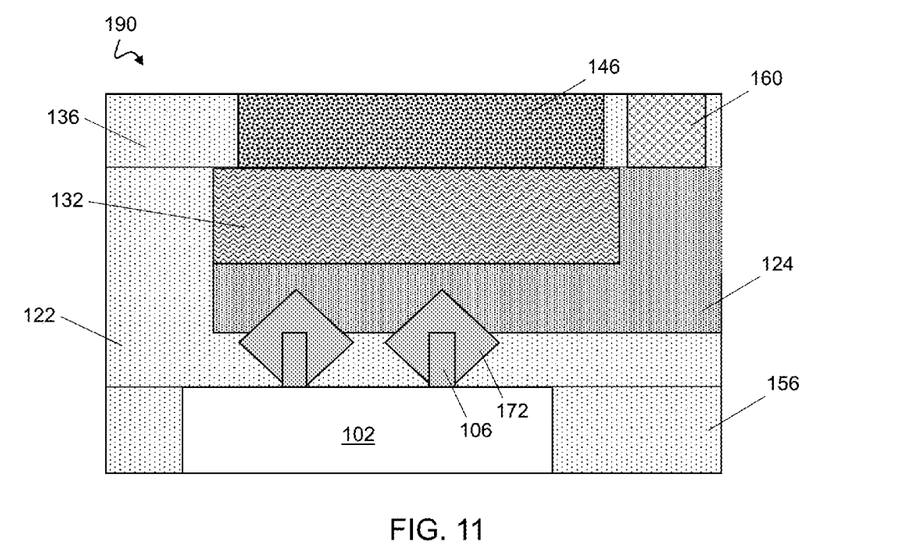
FIG. 11 shows a cross-section of the IC structure of FIG. 10 taken along line D-D.

For example, FIG. 10 shows a top-down view of IC structure 190 according to one embodiment of the disclosure wherein the embodiments described with respect to FIGS. 4-9 show cross-sections taken along line C-C of FIG. 10. FIG. 11 shows a cross-section of IC structure 190 taken along line D-D of FIG. 10. Further, dielectric layers 122, 136 are shown as a phantom box in FIG. 10 such that features of IC structure 190 thereunder can be seen.

Turning now to FIGS. 10-11, conductor 146 may be formed within dielectric layers 122, 136 over one or more gate stacks 110 (FIG. 10) and low-k dielectric layer 132 substantially within the active region of IC structure 190, or over substrate 102, as opposed to substantially over STI region 156 that is adjacent to substrate 102. That is, conductor 146 formed herein is closer to each end of gate stacks 110 than conventional gate contacts over STI region 156. Such a feature results in a reduction of gate resistance and an increase in the maximum oscillation frequency.

As shown in FIGS. 10-11, source/drain contacts 124 may contact epitaxial material 172 surrounding fin 106. However, in other embodiments, source/drain contact 124 may contact fin 106 directly where fin 106 was doped to form source/drain regions 112 (FIG. 9) within fin 106. Further, a portion of source/drain contact 124 over STI region 156 may not have been recessed as was described with respect to FIG. 5. In such an embodiment, the lithographic process used to recess source/drain contact 124 may include covering portions of source/drain contact 124 over STI region 156 with the mask such that the portions of source/drain contact 124 over STI region 156 are not etched or recessed. The portions of source/drain contact 124 over STI region 156 may extend from within dielectric layer 122 to a top surface of dielectric layer 122 such that a top surface of those portions of source/drain contact 124 are substantially planar with a top surface of low-k dielectric layer 132 that is over the portions of the recessed source/drain contact 124.

In further embodiments, it may be desirable to form contacts 160 to source/drain contacts 124 to provide electrical connection from source/drain contacts 124 to metal levels that may be formed above dielectric layer 136. Contacts 160 may be formed over the portions of source/drain contact 124 that was not recessed, or portions of source/drain contact 124 over STI region 156. Contacts 160 may be formed within dielectric layer 136 such that contacts 160 are within the same plane as conductor 146. Contacts 160 may formed within dielectric layer 136 by conventional lithographic techniques, e.g., masking, patterning, etching, depositing, and planarizing. Contacts 160 may include a conductive metal such as any of the conductive metals discussed herein and may be formed simultaneously with the formation of conductor 146. In other embodiments, contacts 160 may be formed before or after the formation of conductor 146.

Figure 12:
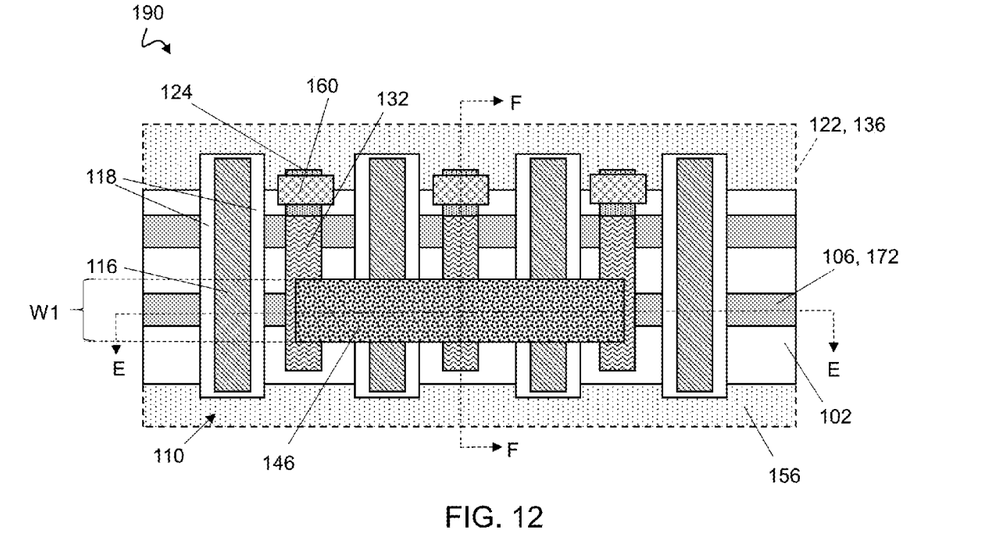
FIG. 12 shows a top-down view of an IC structure according to an embodiment of the disclosure.
Figure 13:
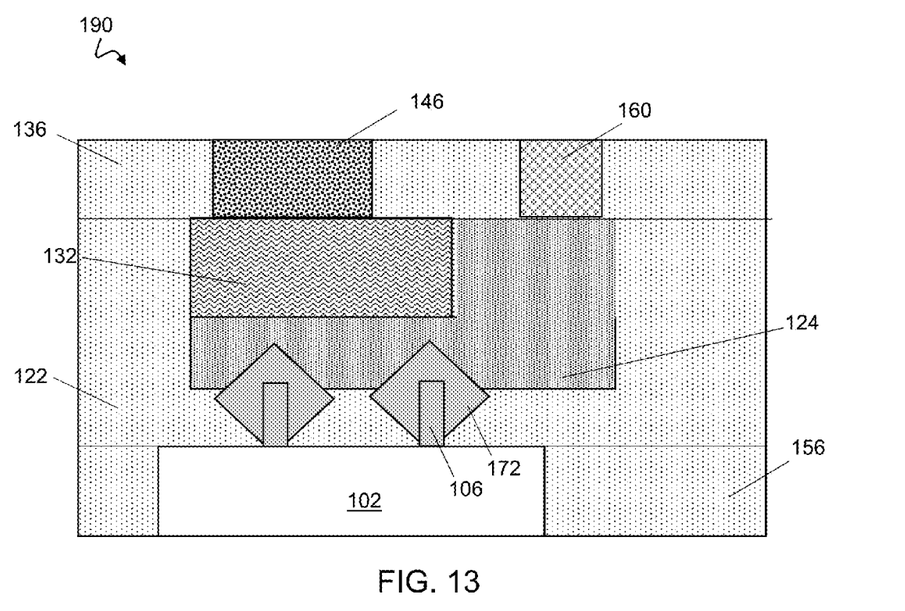
FIG. 13 shows a cross-section of the IC structure of FIG. 12 taken along line F-F.

FIGS. 12-13 show another example of IC structure 190 according to embodiments of the disclosure. FIG. 12 shows a top-down view of IC structure 190 according to one embodiment of the disclosure wherein the embodiments described with respect to FIGS. 4-9 show cross-sections taken along line E-E of FIG. 12. FIG. 13 shows a cross-section of IC structure 190 taken along line F-F of FIG. 12. Further, dielectric layers 122, 136 are shown as a phantom box in FIG. 12 such that features of IC structure 190 thereunder can be seen.

Turning now to FIGS. 12-13, conductor 146 may be formed within dielectric layers 122, 136 over one or more gate stacks 110 (FIG. 12) and over low-k dielectric layer 132 substantially within the active region of IC structure 190, or over substrate 102, as opposed to substantially over STI region 156 that is adjacent to substrate 102. Such a feature results in a reduction of gate resistance and an increase in the maximum oscillation frequency.

As shown in FIGS. 12-13, a portion of source/drain contact 124 may contact epitaxial material 172 surrounding fin 106. However, in other embodiments, source/drain contact 124 may contact fin 106 directly where fin 106 was doped to form source/drain regions 112 (FIG. 9) within fin 106. Further, a portion of source/drain contact 124 over STI region 156 may not have been recessed as was described with respect to FIG. 5. In such an embodiment, the lithographic process used to recess source/drain contact 124 may include covering portions of source/drain contact 124 over STI region 156 with the mask such that the portions of source/drain contact 124 over STI region 156 are not etched or recessed. The portions of source/drain contact 124 over STI region 156 may extend from within dielectric layer 122 to a top surface of dielectric layer 122 such that a top surface of those portions of source/drain contact 124 are substantially planar with a top surface of low-k dielectric layer 132 that is over the portions of the recessed source/drain contact 124. In some embodiments (shown), the unrecessed portion of source/drain contact 124 may straddle a portion of substrate 102 and STI region 156. This embodiment may differ from the embodiment shown in FIGS. 10-11 in that conductor 146 has a width W1 (FIG. 12) that is substantially smaller than a width W2 (FIG. 10) of conductor 146 described with respect to FIGS. 10-11.

In further embodiments, it may be desirable to form contacts 160 to source/drain contacts 124 to provide electrical connection from source/drain contacts to metal levels that may be formed above dielectric layer 136. Contacts 160 may be formed over the portions of source/drain contact 124 that was not recessed, or portions of source/drain contact 124 over STI region 156. Contacts 160 may be formed within dielectric layer 136 such that contacts 160 are within the same plane as conductor 146. Contacts 160 may formed within dielectric layer 136 by conventional lithographic techniques, e.g., masking, patterning, etching, depositing, and planarizing. Contacts 160 may include a conductive metal such as any of the conductive metals discussed herein and may be formed simultaneously with the formation of conductor 146. In other embodiments, contacts 160 may be formed before or after the formation of conductor 146.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit structure, the method comprising:
    reducing a height of a source/drain contact within a first dielectric layer from an initial height above a substrate to a reduced height, the reduced height being less than a height above the substrate of a gate conductor of a gate stack, the gate stack being adjacent to the gate conductor within the dielectric layer, wherein the initial height of the source/drain contact is greater than the height of the gate conductor; and
    forming an upper conductor over and without contacting the source/drain contact, the upper conductor contacting the gate conductor.

2. The method of claim 1, wherein the reducing the height of the source/drain contact includes:
    recessing a portion of the source/drain contact within the first dielectric layer to create a first opening in the first dielectric layer over the recessed portion of the source/drain contact; and
    forming an insulator layer over the recessed portion of the source/drain contact within the first opening wherein the insulator layer electrically isolates the source/drain contact from the upper conductor.

3. The method of claim 2, wherein forming the insulator layer includes forming a low-k dielectric layer over the recessed portion of the source/drain contact within the first opening.

4. The method of claim 2, wherein recessing the portion of the source/drain contact includes recessing the portion of the source/drain contact such that the portion of the source/drain contact remains within the first dielectric layer over a source/drain region.

5. The method of claim 2, wherein forming the conductor includes:
    after the forming of the insulating layer, forming a second dielectric layer over the first dielectric layer and the insulating layer;
    forming a second opening within the second dielectric layer over the insulating layer to expose the insulating layer; and
    forming the conductor within the second opening over the exposed insulating layer.

6. The method of claim 5, further comprising:
    after the forming of the insulating layer and prior to the forming of the second dielectric layer, planarizing the insulating layer to a top surface of the first dielectric layer.

7. The method of claim 5, wherein forming the second opening includes exposing a top surface of the gate conductor within the gate stack.

8. The method of claim 1, further comprising:
forming a contact to an unrecessed portion of the source/drain contact, the unrecessed portion of the source/drain contact being over a shallow-trench isolation (STI) region.

9. The method of claim 1, wherein the initial height of the source/drain contact is substantially co-planar with an upper surface of the first dielectric layer.

10. A method of forming an integrated circuit structure, the method comprising:
reducing a height of one or more source/drain contacts in a set of source/drain contacts from an initial height above a substrate to a reduced height, the reduced height being less than a height above the substrate of a gate conductor within a gate stack of a set of gate stacks, the one or more source/drain contacts in the set of source/drain contacts being adjacent to the gate stack of the set of gate stacks within a first dielectric layer, wherein the initial height of the one or more source/drain contacts is greater than the height of the gate conductor; and
forming an upper conductor over and without contacting the set of source/drain contacts, the upper conductor contacting each gate conductor.

11. The method of claim 10, wherein the reducing the height of the one or more source/drain contacts includes:
recessing a portion of the one or more source/drain contacts within the first dielectric layer to create a first opening in the first dielectric layer over the recessed portion of the one or more source/drain contacts; and
forming an insulator layer over the recessed portion of the one or more source/drain contacts within the first opening wherein the insulator layer electrically isolates the one or more source/drain contacts from the upper conductor.

12. The method of claim 11, wherein forming the insulator layer includes forming a low-k dielectric layer over the recessed portion of the one or more source/drain contacts within the first opening.

13. The method of claim 11, wherein recessing the portion of the one or more source/drain contacts includes recessing the portion of the one or more source/drain contacts such that the portion of one or more source/drain contacts remains within the first dielectric layer over a source/drain region.

14. The method of claim 11, wherein forming the conductor includes:
after forming the insulating layer, forming a second dielectric layer over the first dielectric layer and the insulating layer;
forming a second opening within the second dielectric layer over the insulating layer to expose the insulating layer;
forming the conductor within the second opening over the exposed insulating layer.

15. The method of claim 14, further comprising:
after the forming of the insulating layer and prior to the forming of the second dielectric layer, planarizing the insulating layer to a top surface of the first dielectric layer.

16. The method of claim 14, wherein forming the second opening includes exposing a top surface of the gate conductor within one or more gate stacks in the set of gate stacks.

17. The method of claim 10, wherein the initial height of the one or more source/drain contacts in the set of source/drain contacts is substantially co-planar with an upper surface of the first dielectric layer.

* * * * *